United States Patent [19]

Takaichi et al.

[11] Patent Number: 5,224,262
[45] Date of Patent: Jul. 6, 1993

[54] PARTS MOUNTING MACHINE

[75] Inventors: Susumu Takaichi, Hirakata; Takashi Shimizu, Kishiwada; Kanji Hata, Katano, all of Japan

[73] Assignee: Matsushita Electric Industrial Co., Ltd., Kadoma, Japan

[21] Appl. No.: 857,871

[22] Filed: Mar. 26, 1992

[30] Foreign Application Priority Data

Mar. 28, 1991 [JP] Japan .................................. 3-64589

[51] Int. Cl.⁵ .............................................. H05K 3/30
[52] U.S. Cl. ...................................... 29/721; 29/740; 29/741; 29/833
[58] Field of Search .................. 29/720, 721, 740, 705, 29/833

[56] References Cited

U.S. PATENT DOCUMENTS 4,628,464 12/1986 McConnell ...................... 29/721 X
5,131,139 7/1992 Oyama et al. ...................... 29/721

Primary Examiner—Carl E. Hall
Attorney, Agent, or Firm—Wenderoth, Lind & Ponack

[57] ABSTRACT

An electronic parts mounting apparatus, has a part mounting head on which nozzles for holding different sized electronic parts can be exchangeably mounted; the suction nozzles each having a reflection member thereon for receiving light from below a suction end of the nozzle and reflecting it past the suction end of the nozzle; a recognizing device below the part mounting head for receiving light from the direction of the part mounting head; a first illuminating device adjacent the recognizing device for directing illuminating light to a reflection member on a nozzle on the part mounting head for causing the reflecting member to reflect the illuminating light past a part held on the suction nozzle to direct a transmitted light image of the part to the recognizing device; a shutter movable toward and away from the part mounting head adjacent a position of a nozzle thereon for, when the shutter moves toward a nozzle, engaging the nozzle and blocking light from the first illuminating device from reaching a reflecting member, the shutter absorbing light directed against a surface thereof facing the recognizing means device said shutter is in engagement with a nozzle; and a second illuminating device around the periphery of the recognizing means for directing illuminating light against a part held on a nozzle on the part mounting head for causing the part to reflect a reflected light image of the part to the recognizing device.

1 Claim, 4 Drawing Sheets

PARTS MOUNTING MACHINE

BACKGROUND OF THE INVENTION

The present invention generally relates to a parts mounting machine provided with a parts mounting head which is capable of detaching or selection-switching a plurality of types of suction nozzles, and more particularly, to a parts engaging machine provided with a recognizing means for recognizing parts held on the suction nozzles.

Conventionally, in an electronic parts mounting machine for mounting various sizes of electronic parts on a printed circuit substrate, a plurality of types of suction nozzles are provided for either free detaching or selective switching on a parts engaging head. A large diameter suction nozzle is used for large-sized parts. A small diameter suction nozzle is used for small-sized parts.

A parts recognizing means b for recognizing electronic parts a and a parts illuminating means c for illuminating electronic parts a are provided at a parts recognizing station as shown in FIG. 5 and FIG. 6 for recognizing the shape, posture on the suction nozzle and so on of the electronic parts held by the suction nozzle. A reflection member e for reflecting the illumination from the parts illuminating means c towards the electronic parts a is provided for the recognition of the small sized parts shown in FIG. 5 on a suction nozzle d. Shutter type reflection members f, f which are freely openable and closable are provided in connection with the recognition of the large sized parts shown in FIG. 6 so that the suction nozzle d may be grasped from both the sides, and are adapted to reflect the illumination towards electronic parts a when in the closed condition at the parts recognizing station.

Conventionally, a mounting portion for small sized parts with a suction nozzle d provided with a reflection member e mounted thereon, and a mounting portion for large sized parts with a suction nozzle d having no reflection member e mounted thereon have previously been provided on a parts mounting head having a plurality of nozzle mounting portions thereon. When the suction nozzle d mounted on the mounting portion for small sized parts use is used, the electronic parts a are illuminated by the use of the reflection member e on a suction nozzle d and the shutter type reflection members f, f remain open. When an adsorption nozzle d mounted on the mounting portion for large sized parts is used, the electronic parts a are adapted to be illuminated by the use of the shutter type reflection members f, f.

As the parts recognition is effected by transmission of optical images, when a lead is present on the under side of the electronic parts a in the above described conventional embodiment, the whole lead cannot be directly recognized. The outer shape of the electronic parts a must be recognized. Therefore, the outer shape of the parts is varied, and a problem occurs that the engagement accuracy required cannot be attained. Because the outer shape of the suction nozzle cannot be made larger than the outer shape of the parts in a case of the small sized parts, there is a problem that the suction strength of the nozzle may be weak.

SUMMARY OF THE INVENTION

Accordingly, the present invention has been developed with a view to substantially eliminating the above discussed drawbacks inherent in the prior art, and has for its essential object to provide an improved parts mounting machine.

Another important object of the present invention is to provide an improved parts mounting machine which is capable of optionally switching between parts recognition from transmitted optical images and parts recognition from reflected optical images, optionally recognizing the outer shape of the parts and a lead on the under side of the parts, and recognizing parts smaller than the suction nozzle diameter.

In accomplishing these and other objects, according to one preferred embodiment of the present invention, there is provided a parts mounting machine which includes a parts mounting head capable of detaching and attaching or selectively positionally switching a plurality of types of adsorption nozzles, a recognizing means for recognizing transmitted optical images or reflected optical images of the parts held on the suction nozzles, a reflection member for reflecting towards the parts held on the suction nozzles and the recognizing means illumination from lights provided beside the recognition means, said reflection member being provided on a proper suction nozzle, a shutter member which is freely openable and closable so that the suction nozzle can be grasped from both the sides above the recognizing means, and for absorbing the illuminating light directed towards the suction nozzle parts from the recognizing means and blocking light from reaching the reflection member in the closed condition.

According to the above described construction of the present invention, the transmitted optical images of the parts are recognized by the recognizing means when the suction nozzle is provided on the reflection member and the outer shape of the parts is recognized. The reflected optical images are recognized by the recognizing means when the shutter member is closed so as to grasp the suction nozzle from both the sides, so that a lead on the under face of the parts can be recognized or a part smaller than the suction nozzle diameter can be recognized. The lead can be recognized and engaged with high accuracy upon the recognition of the reflection optical images even when the lead is on the under face. Also, because the suction nozzle can be made larger when using reflected light, the nozzle suction can be improved.

BRIEF DESCRIPTION OF THE DRAWINGS

These and other objects and features of the present invention will become apparent from the following description taken in conjunction with the accompanying drawings, in which.

DETAILED DESCRIPTION OF THE INVENTION

Figure 1A:
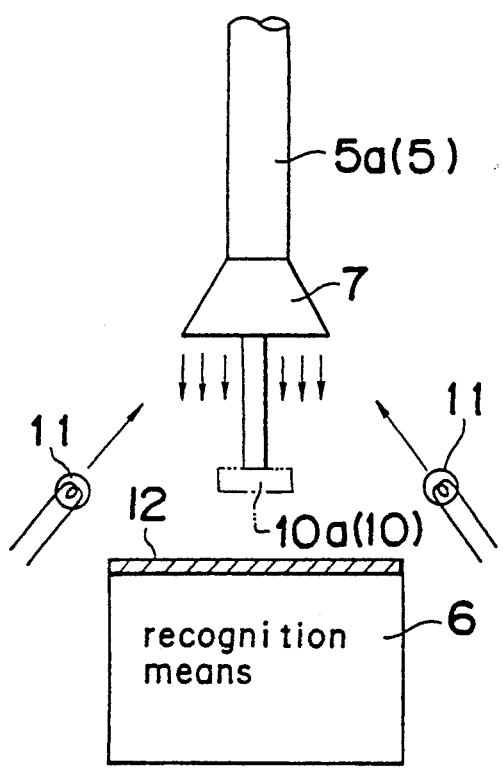
FIG. 1(a) is a schematic elevation view of a parts recognizing apparatus according to one embodiment of the present invention showing the condition in which recognizing is of transmitted optical images of the outer shape of the part.

Before the description of the present invention proceeds, it is to be noted that like parts are designated by like reference numerals throughout the accompanying drawings.

Figure 4:
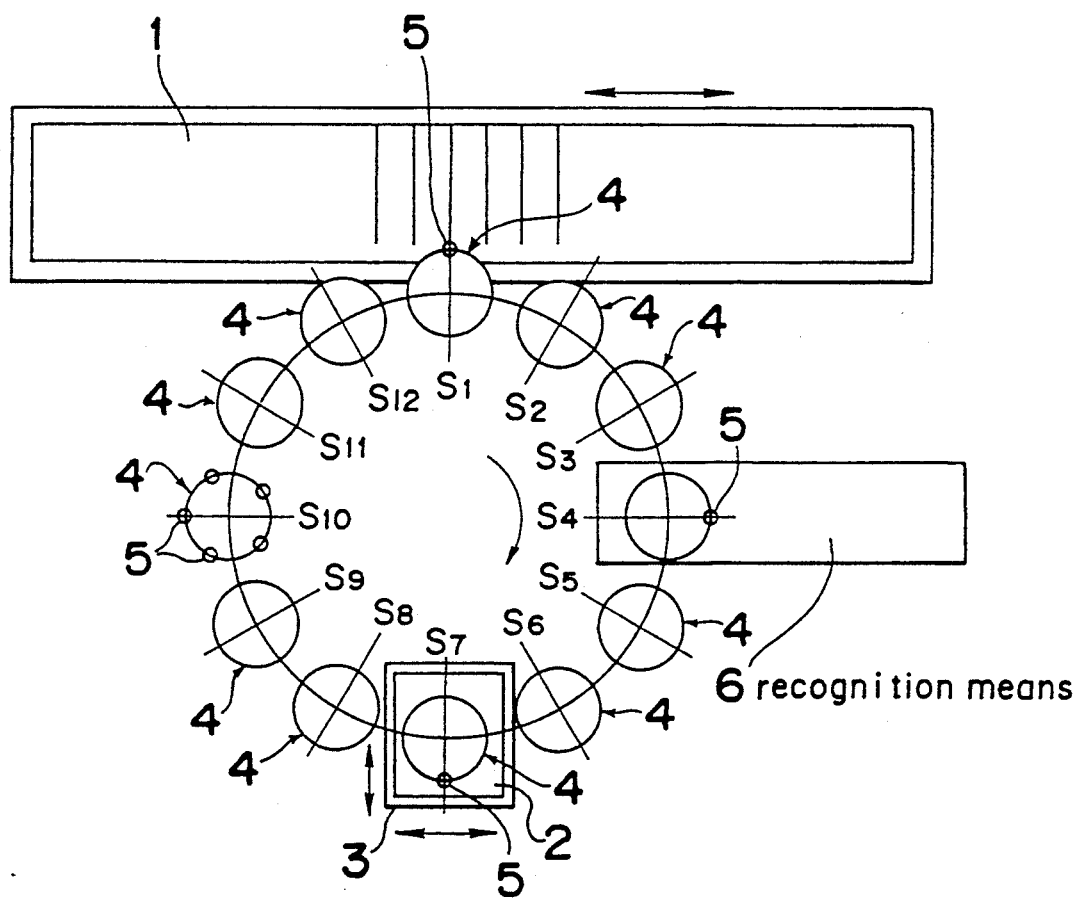
FIG. 4 is a schematic plan view showing the construction of a parts mounting machine.
Figure 5:
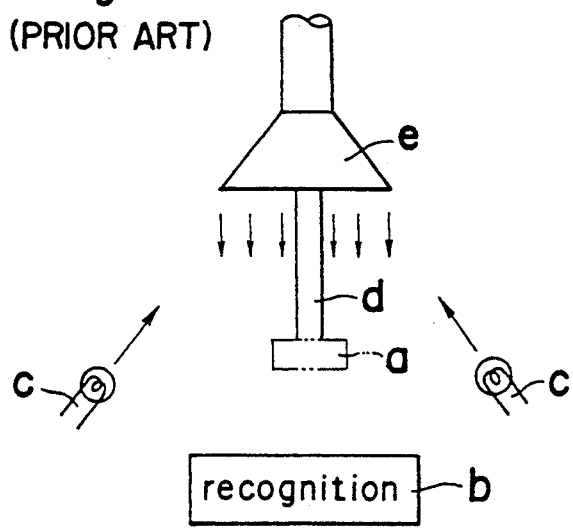
FIG. 5 a schematic elevation view showing a recognizing arrangement for a small sized part in a conventional apparatus.
Figure 6:
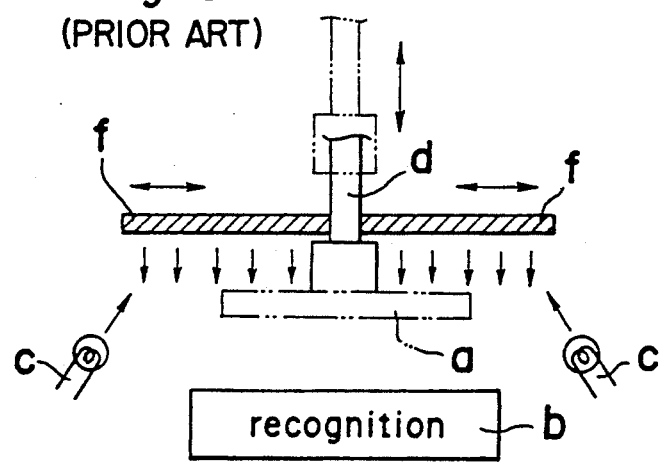
FIG. 6 is a schematic elevation view showing a recognizing arrangement for a large sized part in a conventional apparatus.

Referring now to the drawings, there is shown in FIG. through FIG. 4, a parts mounting machine according to one preferred embodiment of the present invention, where twelve parts engaging heads 4 are disposed in a ring provided between a parts supplying portion 1 for feeding the respective types of electronic parts to be engaged with the printed circuit board 2, or an X - Y table 3 is provided to support the circuit board 2. The parts engaging heads 4 are adapted to be intermittently moved in a clockwise direction with respect to twelve stations S1 through S12.

The respective parts engaging heads 4 are provided with five nozzle mounting portions. The parts engaging head 4 is rotated vertically around a center to enable the selective use of suction nozzles 5 at the nozzle mounting portions. These suction nozzles 5 are divided roughly into a small-sized parts suction nozzle 5a provided with a small diameter reflection member 7 and a large-sized parts suction nozzle 5b provided with a large diameter reflection member 8.

A first station S1 is a parts pick-up station where a suction nozzle 5 on each parts engagement head 4 picks up a given electronic part 10 from the parts feeding portion 1. A second station S2 is an empty station. A third station S3 rotates the suction nozzle 5 with the picked-up part around a center so as to adjust the engagement posture of the parts.

Figure 2:
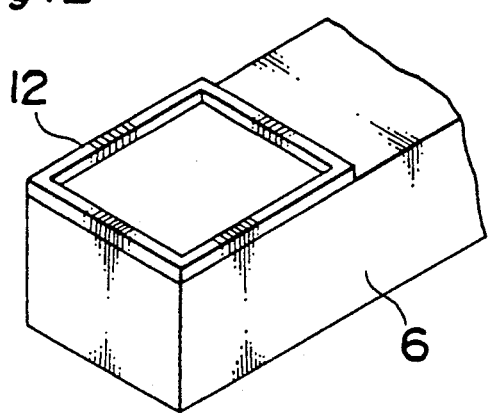
FIG. 2 is a perspective view of a recognizing means and a second illuminating means.

A fourth station S4 is a parts recognizing station, where a recognizing means 6 for recognizing the shape, suction posture and so on of the electronic parts 10 held on the suction nozzle 5 is provided. A first illumination means 11 is provided beside the recognizing means for directing illumination light towards the reflection members 7, 8, for reflecting illuminating light from above toward the electronic parts 10, and a second illuminating means 12 is provided on the recognizing means 6 for directing illumination light onto the under face of the electronic parts 10 disposed at the parts recognizing station S4. The second illuminating means 12 is disposed at the periphery of the image input portion of the parts recognizing means 6 as shown in FIG. 2. Shutter members 13 are provided for freely opening and closing against the suction nozzle 5 from both the sides, and which are closed when the second illuminating means 12 is used. The illumination light is blocked from reaching the reflection members 7, 8 when the shutters member 13 are closed and instead is absorbed by the material of the shutter members.

The rotary posture of the electronic parts 10 is corrected at the fifth station S5. The sixth station S6 is an empty station. In the seventh station S7, an electronic part 10 is engaged with the printed circuit board 2. The eighth station S8 is a nozzle restoring station for restoring the used suction nozzle 5 to an initial position. In the ninth station S9, an electronic part 10 which has not been mounted because it is defective is rejected. The tenth station S10 is a nozzle switching station, where the switching of the suction nozzles 5 (5a, 5b) to be used in accordance with the size of the next electronic part 10 to be picked up is effected for each parts engaging head 4. The eleventh station S11 is a nozzle extending station for extending onto the lower side the adsorption nozzle 5 switched by the tenth station S10. The twelfth station S12 is a nozzle original-point restoring station for restoring to its original rotary portion the suction nozzle 5 adjusted in rotation at the third station S3.

A parts recognizing operation at the parts recognizing station S4 will be described hereinafter.

Figure 3A:
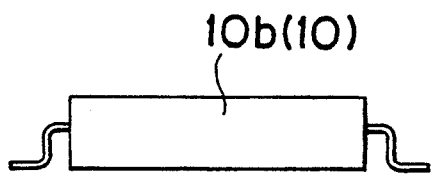
FIG. 3(a) is an elevation view of an example of an electronic part to be recognized by recognizing the outer shape thereof.

As shown in FIG. 1(a), a suction nozzle 5a for a small-sized part is being used as a suction nozzle 5. When a small-sized electronic part 10a is picked up, the light from the first illuminating means 11 is used and reflected by the reflection member 7 from above toward the electronic part 10a, forming a silhouette image which is transmitted as an optical image of the electronic part 10a to the recognizing means 6, and the outer shape of the electronic part is recognized from the transmitted image. The suction nozzle 5b for a large-sized part is being used as shown in (b) of FIG. 1. Even when such a large-sized electronic part 10b, as shown in FIG. 3(a) with leads projecting externally of the edge is picked up, transmitted optical images from light reflected by the reflection member 8 are recognized by the recognizing means 6 as in FIG. 1(a), although the adsorption nozzle 5b is larger, from the outer shape of the electronic part 10b.

Figure 1B:
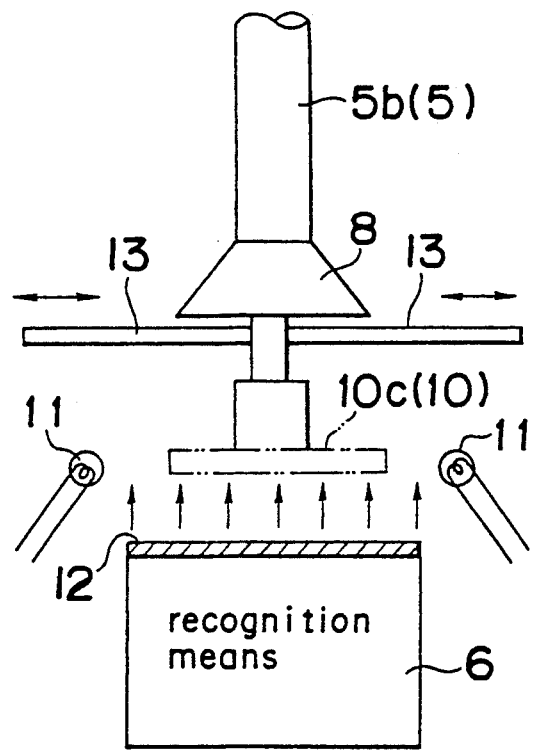
FIG. 1(b) is a front elevation view of the apparatus of FIG. 1(a) in which recognizing is of reflected optical images of the under face of the parts.
Figure 3B:
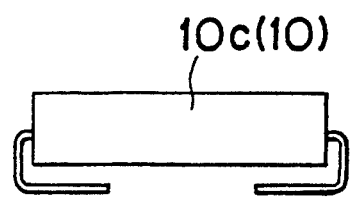
FIG. 3(b) is an elevation view of an electronic part which must be recognized as having a lead on the under face thereof.

However, when a suction nozzle 5b for a large-sized part is being used as shown in FIG. 1(b), and an electronic part 10c with a lead on the underside as shown in FIG. 3(b) is picked up, the reflection member 8 is blocked form receiving light by closing shutter members 13, so that the suction nozzle 5b is grasped from both the sides, and the under face of the electronic part 10c is illuminated by the second illuminating means 12 in this condition, and the reflection optical image of the under face of the electronic part 10c is recognized by the recognizing means 6 so as to recognize the lead on the under face of the electronic part 10c. Similarly, when an electronic part 10 smaller than the diameter of the suction nozzle 5 is picked up, the shutters 13 are closed, and the outer shape of the electronic part can be recognized by the reflected optical images. Therefore, the diameter of the absorption nozzle 5 need not be made smaller than the electronic part 10, so that even when a small-sized electronic part 10 is picked up, the strength of the suction nozzle 5 can be maintained.

According to the present embodiment, parts recognition by recognition of the transmitted optical images or the reflected optical images can be selected in accordance with the electronic part 10 picked up by the suction nozzle 5. The recognizing operation can be precisely effected properly in accordance with whether only the outer shape of the electronic part 10 has to be recognized, or whether the lead on the under face of the electronic part 10 is required to be recognized. As the recognition can be effected by the recognition of the reflected optical images even when the size of the electronic part 10 is smaller than the diameter of the suction nozzle 5, a large strength suction can be used as the nozzle 5.

As is clear form the foregoing description, according to the arrangement of the present invention, when the outer shape of the parts is recognized, the transmitted optical images of the parts are recognized by the recognizing means by the use of the suction nozzle provided on the reflection member so that the outer shape of the part is recognized. The reflected optical images are recognized by the recognizing means while the shutter members are closed and the suction nozzle is grasped form both the sides when the lead on the under face side of the parts must be recognized. Thus, the lead can be recognized. Thus, for any part, the mounting can be effected with high accuracy. A recognizing operation can also be effected by the recognition of the reflected optical images when a part smaller than the adsorption nozzle diameter is picked up, with an effect that the nozzle suction strength can be improved by making the suction nozzle larger than the part.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

We claim:

1. An electronic parts mounting apparatus, comprising:
   a part mounting head having a nozzle mounting means thereon on which nozzles for holding different sized electronic parts can be exchangeably mounted;
   suction nozzles exchangeably mounted on said part mounting head, each having a reflection member thereon for receiving light from below a suction end of the nozzle and reflecting it past the suction end of the nozzle;
   a recognizing means below said part mounting head for receiving light from the direction of said part mounting head;
   a first illuminating means adjacent said recognizing means for directing illuminating light to a reflection member on a nozzle on said part mounting head for causing said reflecting member to reflect the illuminating light past a part held on said suction nozzle to direct a transmitted light image of the part to said recognizing means:
   a shutter means movable toward and away from said part mounting head adjacent a position of a nozzle thereon for, when said shutter means moves toward a nozzle, engaging said nozzle between the suction end and said reflection member and blocking light from said first illuminating means from reaching a reflecting member, said shutter means having means for absorbing light directed against a surface thereof facing said recognizing means when said shutter means is in engagement with a nozzle; and
   second illuminating means around the periphery of said recognizing means for directing illuminating light against a part held on a nozzle on said part mounting head for causing the part to reflect the illuminating light back to said recognizing means to direct a reflected light image of the part to said recognizing means.

* * * * *